(12) United States Patent
Guo et al.

(10) Patent No.: US 12,046,181 B2
(45) Date of Patent: Jul. 23, 2024

(54) SHIFT REGISTER, GATE DRIVING CIRCUIT AND DISPLAY PANEL

(71) Applicant: YUNGU (GU'AN) TECHNOLOGY CO., LTD., Hebei (CN)

(72) Inventors: Enqing Guo, Hebei (CN); Junfeng Li, Hebei (CN); Cuili Gai, Hebei (CN); Ling Wang, Hebei (CN)

(73) Assignee: Yungu (Gu'an) TechnologyCo., Ltd., Langfang (CN)

( * ) Notice: Subject to any disclaimer, the term of this patent is extended or adjusted under 35 U.S.C. 154(b) by 0 days.

(21) Appl. No.: 18/299,866

(22) Filed: Apr. 13, 2023

(65) Prior Publication Data
US 2023/0252933 A1    Aug. 10, 2023

Related U.S. Application Data

(63) Continuation of application No. PCT/CN2021/131987, filed on Nov. 22, 2021.

(30) Foreign Application Priority Data

Jan. 29, 2021 (CN) ......................... 202110129862.4

(51) Int. Cl.
*G09G 3/20* (2006.01)
*G11C 19/28* (2006.01)

(52) U.S. Cl.
CPC .......... *G09G 3/2092* (2013.01); *G11C 19/28* (2013.01); *G09G 2310/0267* (2013.01); *G09G 2310/0286* (2013.01)

(58) Field of Classification Search
CPC ......... G09G 3/2092; G09G 2310/0267; G09G 2310/0286; G09G 2310/08; G09G 3/20; G09G 3/3266; G09G 3/3677; G11C 19/28
See application file for complete search history.

(56) References Cited

U.S. PATENT DOCUMENTS

2007/0001991 A1* 1/2007 Jang ................. G11C 19/28
                                                         345/100
2008/0266477 A1* 10/2008 Lee ..................... G09G 3/3677
                                                         345/94
(Continued)

FOREIGN PATENT DOCUMENTS

CN      104409038 A      3/2015
CN      105161134 A      12/2015
(Continued)

OTHER PUBLICATIONS

International Search Report mailed Jan. 28, 2022, in International Application No. PCT/CN2021/131987, 6 pages.
(Continued)

*Primary Examiner* — Sahlu Okebato
(74) *Attorney, Agent, or Firm* — Maier & Maier, PLLC

(57) ABSTRACT

A shift register, a gate driving circuit, and a display panel. The shift register includes a first input module, a second input module, a first output module, a second output module, a first output control module, and a second output control module, where the first input module is configured to control the potential of a first node according to a first start signal and a first clock signal, the second input module is configured to control the potential of a second node according to a second start signal and the first clock signal, and the second start signal and the first start signal have opposite potentials; the first output module includes a first coupling unit configured to couple the potential of a third node according to the potential of a first output terminal in the case where the potential of the first output terminal jumps.

20 Claims, 6 Drawing Sheets

(56) References Cited

U.S. PATENT DOCUMENTS

2009/0167668 A1* 7/2009 Kim .................... G09G 3/3677
                                                                 345/100
2022/0230593 A1* 7/2022 Huang .................. G11C 19/28

FOREIGN PATENT DOCUMENTS

| CN | 105761663 A | 7/2016 |
| CN | 205992407 U | 3/2017 |
| CN | 106683634 A | 5/2017 |
| CN | 107919159 A | 4/2018 |
| CN | 108682396 A | 10/2018 |
| CN | 111145823 A | 5/2020 |
| CN | 111369927 A | 7/2020 |
| CN | 111583850 A | 8/2020 |
| CN | 111696469 A | 9/2020 |
| CN | 112687230 A | 4/2021 |
| KR | 20150116102 A | 10/2015 |

OTHER PUBLICATIONS

Office Action issued on Mar. 9, 2022, in corresponding Chinese Application No. 202110129862.4, 10 pages.

* cited by examiner

SHIFT REGISTER, GATE DRIVING CIRCUIT AND DISPLAY PANEL

CROSS-REFERENCE TO RELATED APPLICATIONS

This application is a continuation application of International Patent Application No. PCT/CN2021/131987, filed on Nov. 22, 2021, which claims priority to Chinese Patent Application No. 202110129862.4 filed on Jan. 29, 2021, disclosures of both of which are incorporated herein by reference in their entireties.

TECHNICAL FIELD

The present application relates to the field of display technologies, for example, a shift register, a gate driving circuit, and a display panel.

BACKGROUND

With the development of display technologies, people have increasingly higher requirements for the performance of a display panel.

The display panel generally includes a gate driving circuit. The gate driving circuit includes a plurality of cascaded shift registers. When an output signal of each shift register jumps from a high level to a low level, two steps occur at the falling edge of the output signal, and the output signal has a tailing, affecting the stability of output signals of the shift registers and limiting the application of the gate driving circuit.

SUMMARY

The present application provides a shift register, a gate driving circuit, and a display panel to improve the tailing problem of the output signals of the shift registers, reduce the level loss of the output signals, and improve the stability of the output signals of the shift registers.

The present application provides a shift register including a first input module, a second input module, a first output module, a second output module, a first output control module, and a second output control module.

The first input module is configured to control the potential of a first node according to a first start signal and a first clock signal, the second input module is configured to control the potential of a second node according to a second start signal and the first clock signal, and the second start signal and the first start signal have opposite potentials.

The first output control module is configured to control the potential of a third node according to the potential of the first node, the potential of the second node, a first potential signal, and the second clock signal, the first output module is configured to transmit the first potential signal or a second potential signal to a first output terminal of the shift register according to the potential of the first node and the potential of the third node, the first output module includes a first coupling unit configured to couple the potential of the third node according to the potential of the first output terminal in the case where the potential of the first output terminal jumps.

The second output control module is configured to control the potential of a fourth node according to the potential of the first node, the potential of the second node, the first potential signal, and the second clock signal, the second output module is configured to transmit the first potential signal or the second potential signal to a second output terminal of the shift register according to the potential of the fourth node and the potential of the first output terminal, the second output module includes a second coupling unit configured to couple the potential of the fourth node according to the potential of the second output terminal in the case where the potential of the second output terminal jumps.

The present application also provides a gate driving circuit including the shift register described above, where the plurality of shift registers are connected in cascade; and a first start signal input terminal of a first stage shift register is configured to be input into first start signals, a second start signal input terminal of the first stage shift register is configured to be input into second start signals, a first output terminal of the first stage shift register is electrically connected to a second start signal input terminal of a next stage shift register, a second output terminal of the first stage shift register is electrically connected to a first start signal input terminal of the next stage shift register.

The present application also provides a display panel including the gate driving circuit described above. The display panel also includes a first clock signal line, a second clock signal line, a first potential signal line, and a second potential signal line.

The first clock signal line is configured to transmit first clock signals to the plurality of shift registers; the second clock signal line is configured to transmit second clock signals to the plurality of shift registers; the first potential signal line is configured to transmit first potential signals to the plurality of shift registers; and the second potential signal line is configured to transmit second potential signals to the plurality of shift registers.

In the shift register, the gate driving circuit, and the display panel provided by the present application, the first output control module can couple the potential of the third node to a potential low enough through the first coupling unit when the first output terminal jumps from a high potential to a low potential to reduce the level loss when the first output module transmits the second potential signal to the first output terminal, thereby improving the tailing problem at the falling edge of the output signal of the first output terminal. Moreover, the first output control module can also periodically pull down the potential of the third node in the process in which the first output module transmits the second potential signal to the first output terminal, thereby reducing the level loss when the first output terminal outputs the second potential signal. Similarly, the second output control module can reduce the level loss when the second output module transmits the second potential signal to the second output terminal through the second coupling unit, thereby improving the tailing problem at the falling edge of the output signal of the second output terminal. Moreover, the second output control module can further reduce the level loss when the second output module outputs the second potential signal to the second output terminal. Moreover, the pulse width of an effective level signal of first start signals is adjusted so that the pulse width of effective level signals output from the first output terminal and the pulse width of effective level signals output from the second output terminal can be adjusted. In the technical solutions of the present application, two paths of output signals whose pulse width of the effective level signals is adjustable are obtained through the shift registers according to two opposite paths of input signals, facilitating reducing the level loss when the shift registers output the effective level signals, thereby improving the tailing problem at the falling edge of the output signals, and helping to maintain the stability when the shift registers output the effective level signals, thereby making the application range of the shift registers wider.

DETAILED DESCRIPTION

The present application is described below in conjunction with drawings and embodiments.

Figure 1:
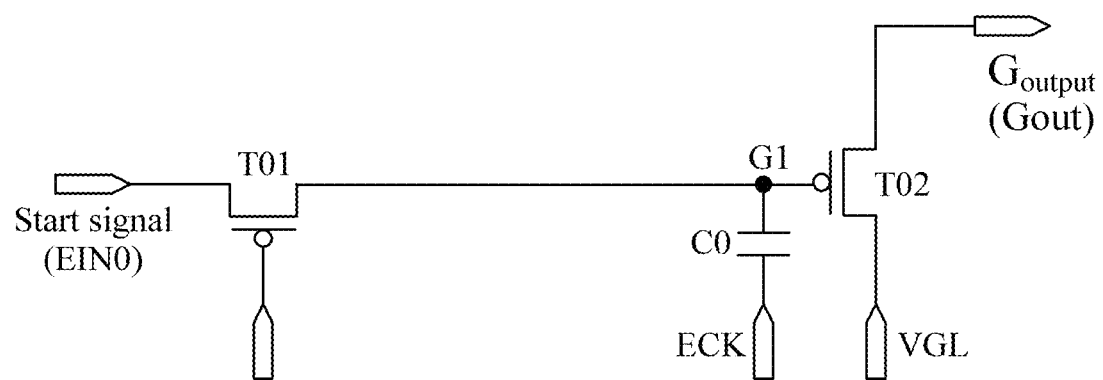
FIG. 1 is a structure diagram of a shift register in the related art.
Figure 2:
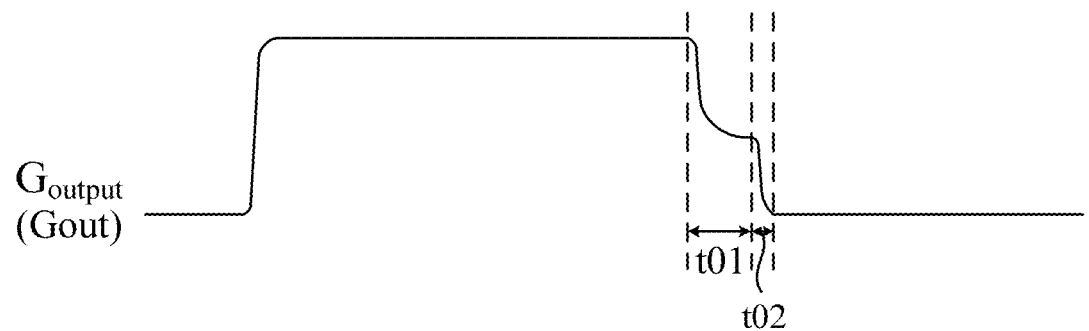
FIG. 2 is a timing diagram of an output signal in the related art.

As described in BACKGROUND, when the output signal of the shift register jumps from the high level to the low level, two steps occur at the falling edge of the output signal, and the output signal has a tailing, affecting the stability of the output signals of the shift registers and limiting the application of the gate driving circuit. The reason for the above problems is that the shift register in the gate driving circuit generally includes a low level output control unit and a low level output unit. FIG. 1 is a structure diagram of a shift register in the related art. Here, only part of the structure of the shift register in the related art is shown in FIG. 1. FIG. 2 is a timing diagram of an output signal in the related art. Referring to FIG. 1, the low level output control unit includes an output control transistor T01, and the low level output unit includes an output transistor T02.

Due to the existence of the threshold voltage of the output control transistor T01 itself, when the output control transistor T01 is a p-type transistor, a low-level loss exists when the output control transistor T01 transmits a low level so that the voltage of the low-level signal reaching the gate G1 of the output transistor T02 is greater than the voltage of the low-level signal in a start signal EIN0 at an input terminal of the output control transistor T01. For example, the voltage of the low-level signal in the start signal EIN0 is −7V, and the threshold voltage of the output control transistor T01 is −2V, constrained by the conduction conditions of the transistor, so the potential of the low-level signal reaching a gate of the output transistor T02 is −5V. However, due to the existence of the threshold voltage of the output transistor T02 itself, when the output transistor T02 is a p-type transistor, a low-level loss also exists when the output transistor T02 transmits the low-level signal, causing the voltage of the output low-level signal to be higher. For example, when the voltage reaches the gate of the output transistor T02 is −5V, the voltage of the low-level signal VGL input to an input terminal of the output transistor T02 is −7V, and the threshold voltage of the output transistor T02 is −2V, constrained by the conduction conditions of the transistor, so the voltage output from the output transistor T02 is −3V. It can be seen that, due to the existence of the threshold voltage of the output control transistor T01 itself and the existence of the threshold voltage of the output transistor T02 itself, the voltage value of the low-level signal output from the output transistor T02 is relatively high. To solve the above problems, in the related art, the shift register is usually configured to include a bootstrap unit. FIG. 1 shows the case where the bootstrap unit includes a bootstrap capacitor C0. When the shift register needs to output the low-level signal, the voltage of the gate of the output transistor T02 is reduced by the bootstrap action of the bootstrap unit, thereby ensuring the voltage value of the low-level signal to be low enough to satisfy the driving requirements of the pixel circuit. However, in the related art, the bootstrap action of the bootstrap unit occurs after the low-level signal is output for a certain period so that two steps in phase t01 and phase t02 shown in FIG. 2 occur during the jump from the high-level signal to the low-level signal, causing the signal tailing, affecting the stability of the output signals of the shift registers, and limiting the application of the gate driving circuit.

Figure 3:
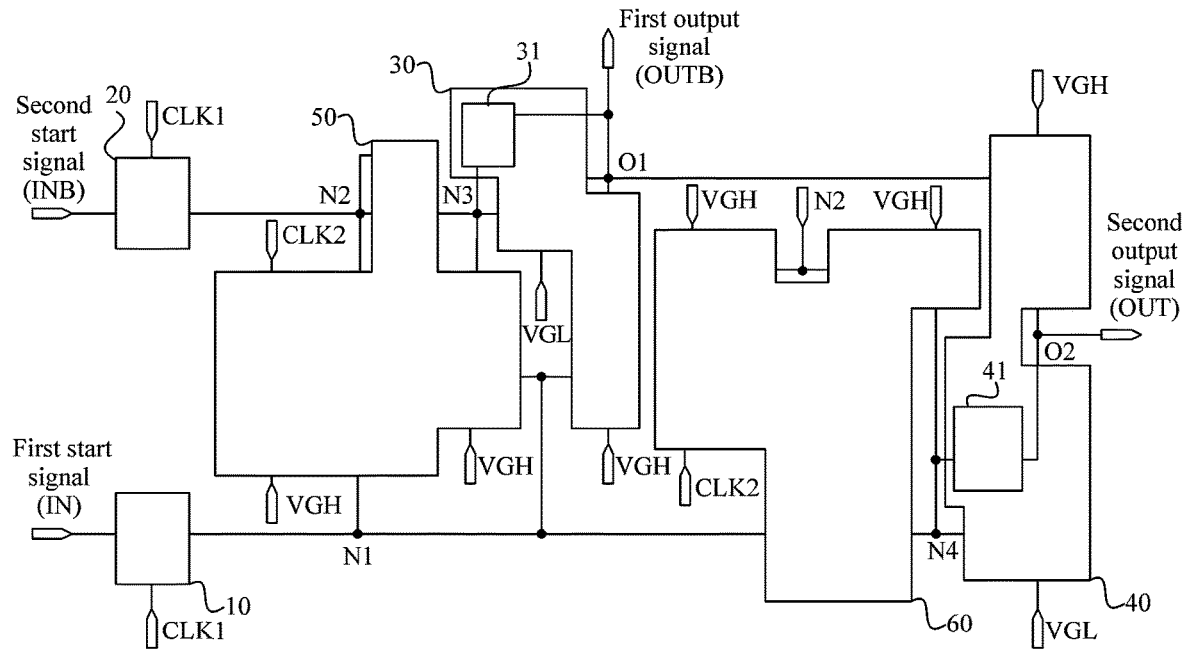
FIG. 3 is a structure diagram of modules of a shift register according to an embodiment of the present application.

Embodiments of the present application provide shift registers. FIG. 3 is a structure diagram of modules of a shift register according to an embodiment of the present application. As shown in FIG. 3, each shift register includes a first input module 10, a second input module 20, a first output module 30, a second output module 40, a first output control module 50, and a second output control module 60. The first input module 10 is configured to control the potential of a first node N1 according to a first start signal IN and a first clock signal CLK1. The second input module 20 is configured to control the potential of a second node N2 according to a second start signal INB and the first clock signal CLK1. The second start signal INB and the first start signal IN have opposite potentials. The first output control module 50 is configured to control the potential of a third node N3 according to the potential of the first node N1, the potential of the second node N2, a first potential signal VGH, and the second clock signal CLK2. The first output module 30 is configured to transmit the first potential signal VGH or a second potential signal VGL to a first output terminal O1 of the shift register according to the potential of the first node N1 and the potential of the third node N3. The first output module 30 includes a first coupling unit 31 configured to couple the potential of the third node N3 according to the potential of the first output terminal O1 in the case where the potential of the first output terminal O1 jumps. The second output control module 60 is configured to control the potential of a fourth node N4 according to the potential of the first node N1, the potential of the second node N2, the first potential signal VGH, and the second clock signal CLK2. The second output module 40 is configured to transmit the first potential signal VGH or the second potential signal VGL to a second output terminal O2 of the shift register according to the potential of the fourth node N4 and the potential of the first output terminal O1. The second output module 40 includes a second coupling unit 41 configured to couple the potential of the fourth node N4 according to the potential of the second output terminal O2 in the case where the potential of the second output terminal O2 jumps.

The first start signal IN may be a pulse signal having an adjustable pulse width. For example, the pulse width of the effective signal of first start signals IN is greater than the pulse width of the effective signal of second clock signals CLK2. The second start signal INB and the first start signal IN have opposite potentials. For example, when the first start signal IN is at a low level, the second start signal INB is at a high level; or when the first start signal IN is at a high level, the second start signal INB is at a low level. The shift register may generate an inverse signal of the first start signal IN according to the received first start signal IN through the internal structure of the sift register to obtain the second start signal INB by borrowing the internal signal. For example, the shift register may include an inverter. The shift register may obtain the inverse signal of the first start signal IN through the inverter, i.e. the second start signal INB, and input the second start signal INB to the second input module 20 to make the shift register have one path of first start signals IN and one path of second start signals INB, where the one path of first start signals IN and the one path of second start signals INB are forward and reward paths of input signals.

Effective level signals among the first clock signal CLK1, the second clock signal CLK2, a potential signal of the first node N1, a potential signal of the second node N2, a potential signal of the third node N3, a potential signal of the fourth node N4, and a potential signal of the first output terminal O1 may all be low-level signals, or high-level signals. The first potential signal VGH and the second potential signal VGL have opposite potentials. For example, when the first potential signal VGH is a high-level signal, the second potential signal VGL is a low-level signal; or when the first potential signal VGH is a low-level signal, the second potential signal VGL is a high-level signal. In this embodiment and the embodiments below, the case where the effective level signals among the first clock signal CLK1, the second clock signal CLK2, the potential signal of the first node N1, the potential signal of the second node N2, the potential signal of the third node N3, the potential signal of the fourth node N4, and the potential signal of the first output terminal O1 are low-level signals, the first potential signal VGH is a high-level signal, and the second potential signal VGL is a low-level signal is used as an example for description.

The case where the first input module 10 controls the potential of the first node N1 according to the first start signal IN and the first clock signal CLK1 means that the first input module 10 can transmit the first start signal IN to the first node N1 in response to the effective level signal of the first clock signal CLK1. The case where the second input module 20 is configured to control the potential of the second node N2 according to the second start signal INB and the first clock signal CLK1 means that the second input module 20 can transmit the second start signal INB to the second node N2 in response to the effective level signal of the first clock signal CLK1.

The case where the first output module 30 is configured to transmit the first potential signal VGH or the second potential signal VGL to the first output terminal O1 of the shift register according to the potential of the first node N1 and the potential of the third node N3 means that the first output module 30 can transmit the first potential signal VGH to the first output terminal O1 in response to the effective level signal of the first node N1 and transmit the second potential signal VGL to the first output terminal O1 in response to the effective level signal of the third node N3.

The first coupling unit 31 can couple the potential of the third node N3 according to the potential of the first output terminal O1 when the potential of the first output terminal O1 jumps. For example, the first coupling unit 31 is connected between the first output terminal O1 and the third node N3. The first coupling unit 31 can couple the potential of the third node N3 according to the jump degree of the potential of the first output terminal O1 at the time when the potential of the first output terminal O1 jumps to make the potential of the third node N3 jump to the corresponding potential in the same degree. For example, before the effective level signal (i.e. the low-level signal) of the third node N3 arrives, the first output module 30 transmits the first potential signal VGH to the first output terminal O1, the potential of the first output terminal O1 is a high potential. When the low-level signal of the third node N3 arrives, the first output module 30 transmits the second potential signal VGL to the first output terminal O1 in response to the low-level signal of the third node N3, and the potential of the first output terminal O1 jumps from a high potential to a low potential. Due to the coupling effect of the first coupling unit 31, the first coupling unit 31 may couple the potential of the third node N3 to a potential lower than the potential of the second potential signal VGL when the potential of the first output terminal O1 jumps. The first output module 30 works in response to the low-level signal of the third node N3. If the potential of the third node N3 is not low enough (i.e. the absolute value of the difference between the potential of the third node N3 and the second potential signal VGL is greater than a set threshold value), the second potential signal VGL transmitted from the first output module 30 to the first output terminal O1 has a level loss, causing a signal tailing at the falling edge of the output signal of the first output terminal O1 as shown in FIG. 2.

Compared with the existing solutions shown in FIG. 1, in this embodiment, the first coupling unit 31 may couple the potential of the third node N3 to the potential lower than the potential of the second potential signal VGL at the time when the potential of the first output terminal O1 jumps to make the third node N3 reach a low enough potential (this low enough potential satisfies that the difference between the potential of the third node N3 and the potential of the second potential signal VGL is less than the set threshold value), thereby reducing the level loss when the first output module 30 transmits the second potential signal VGL to the first output terminal O1, and making the output signal of the first output terminal O1 directly jump from the first potential signal VGH to the second potential signal VGL to improve the tailing problem at the falling edge of the output signal of the first output terminal O1. When the first output module 30 includes a transistor of which a gate is connected to the third node N3, a first electrode is connected to the second potential signal VGL, and a second electrode is connected to the first output terminal O1, and the transistor is a p-type transistor, the set threshold value may be equal to the threshold voltage of the transistor.

The case where the first output control module 50 controls the potential of the third node N3 according to the potential of the first node N1, the potential of the second node N2, the first potential signal VGH, and the second clock signal CLK2 means that the first output control module 50, under the control of the potential of the first node N1, the potential of the second node N2, the first potential signal VGH, and the second clock signal CLK2, can control the potential of the third node N3 by controlling the potential of the second node N2 when the potential of the second clock signal CLK2 jumps. For example, the first output control module 50 can pull down the potential of the second node N2 to the potential lower than the potential corresponding to the second potential signal VGL, and pull down the potential of the third node N3 to the potential lower than the potential corresponding to the second potential signal VGL.

Since the first coupling unit 31 can couple the potential of the third node N3 to the potential lower than the potential of the second potential signal VGL at the time when the output signal of the first output terminal O1 jumps from the first potential signal VGH to the second potential signal VGL to make the potential of the third node N3 extremely low, a leakage path may be generated between the first output control module 50 and the third node N3 in the subsequent process in which the first output module 30 transmits the second potential signal VGL to the first output terminal O1. For example, when the first output control module 50 includes the transistor connected to the third node N3, the leakage path may be generated between this transistor and the third node N3 so that the leakage current makes the potential of the third node N3 slowly increase through the transistor in the first output control module 50. If the potential of the third node N3 is not low enough, the second potential signal VGL transmitted from the first output module 30 to the first output terminal O1 still has the level loss. In this embodiment, the first output module 30 can pull down the potential of the third node N3 to the potential lower than the potential of the second potential signal VGL after the output signal of the first output terminal O1 jumps from the first potential signal VGH to the second potential signal VGL, i.e. the process in which the first output terminal O1 outputs the second potential signal VGL, to make the potential of the third node N3 reach a low enough potential, thereby reducing the level loss of the low-level signal output from the first output terminal O1. Moreover, since the second clock signal CLK2 may be a periodic clock signal, the first output control module 50 can also periodically pull down the potential of the third node N3 to the potential lower than the potential of the second potential signal VGL when the potential of the second clock signal CLK2 jumps. Even if the potential of the third node N3 keeps extremely low for a long time, the potential of the third node N3 is not raised to a potential higher than the potential of the second potential signal VGL due to the leakage. Therefore, this embodiment not only reduces the level loss of the effective level signal output from the first output terminal O1, but also improves the tailing problem of the output signals, helping to maintain the stability of the first output terminal O1 in outputting the effective level signals for a long time.

The case where the second output module 40 transmits the first potential signal VGH or the second potential signal VGL to the second output terminal O2 of the shift register according to the potential of the fourth node N4 and the potential of the first output terminal O1 means that the second output module 40 can transmit the first potential signal VGH to the second output terminal O2 in response to the effective level signal of the first output terminal O1 and transmits the second potential signal VGL to the second output terminal O2 in response to the effective level signal of the fourth node N4.

The second coupling unit 41 can couple the potential of the fourth node N4 according to the potential of the second output terminal O2 when the potential of the second output terminal O2 jumps. For example, the second coupling unit 41 is connected between the second output terminal O2 and the fourth node N4. The second coupling unit 41 can couple the potential of the fourth node N4 according to the jump degree of the potential of the second output terminal O2 at the time when the potential of the second output terminal O2 jumps to make the potential of the fourth node N4 jump to the corresponding potential in the same degree. For example, before the effective level signal (i.e. the low-level signal) of the fourth node N4 arrives, the second output module 40 transmits the first potential signal VGH to the second output terminal O2, and the potential of the second output terminal O2 is a high potential. When the low-level signal of the fourth node N4 arrives, the second output module 40 transmits the second potential signal VGL to the second output terminal O2 in response to the low-level signal of the fourth node N4, and the potential of the second output terminal O2 jumps from a high potential to a low potential. Due to the coupling action of the second coupling unit 41, the second coupling unit 41 may couple the potential of the fourth node N4 to the potential lower than the potential of the second potential signal VGL when the potential of the second output terminal O2 jumps. The second output module 40 works in response to the low-level signal of the fourth node N4. If the potential of the fourth node N4 is not low enough (i.e. the difference between the potential of the fourth node N4 and the second potential signal VGL is greater than the set threshold value), the second potential signal VGL transmitted from the second output module 40 to the second output terminal O2 has a level loss, causing a signal tailing at the falling edge of the output signal of the second output terminal O2 as shown in FIG. 2.

Compared with the existing solutions shown in FIG. 1, in this embodiment, the second coupling unit 41 may also couple the potential of the fourth node N4 to the potential lower than the potential of the second potential signal VGL at the time when the potential of the second output terminal O2 jumps to make the fourth node N4 reach a low enough potential (this low enough potential satisfies that the difference between the potential of the fourth node N4 and the potential of the second potential signal VGL is less than the set threshold value), thereby reducing the level loss when the second output module 40 transmits the second potential signal VGL to the second output terminal O2, and making the output signal of the second output terminal O2 directly jump from the first potential signal VGH to the second potential signal VGL to improve the tailing problem at the falling edge of the output signal of the second output terminal O2. When the second output module 40 includes a transistor of which a gate is connected to the fourth node N4, a first electrode is connected to the second potential signal VGL, and a second electrode is connected to the second output terminal O2, and the transistor is a p-type transistor, the set threshold value may be equal to the threshold voltage of the transistor.

The case where the second output control module 60 controls the potential of the fourth node N4 according to the potential of the first node N1, the potential of the second node N2, the first potential signal VGH, and the second clock signal CLK2 means that the second output control module 60, under the control of the potential of the first node N1, the potential of the second node N2, the first potential signal VGH, and the second clock signal CLK2, can control the potential of the fourth node N4 when the potential of the second clock signal CLK2 jumps. For example, the second output control module 60 can pull down the potential of the fourth node N4 to the potential lower than the potential corresponding to the second potential signal VGL.

Since the second coupling unit 41 can couple the potential of the fourth node N4 to the potential lower than the potential of the second potential signal VGL at the time when the output signal of the second output terminal O2 jumps from the first potential signal VGH to the second potential signal VGL to make the potential of the fourth node N4 extremely low, a leakage path may be generated between the second output control module 60 and the fourth node N4 in the subsequent process in which the second output module 40 transmits the second potential signal VGL to the second output terminal O2. For example, when the second output control module 60 includes the transistor connected to the fourth node N4, the leakage path may be generated between the transistor and the fourth node N4 so that the leakage current makes the potential of the fourth node N4 slowly increase through the transistor in the second output control module 60. If the potential of the fourth node N4 is not low enough, the second potential signal VGL transmitted from the second output module 40 to the second output terminal O2 still has the level loss. In this embodiment, the second output module 40 can pull down the potential of the fourth node N4 to the potential lower than the potential of the second potential signal VGL after the output signal of the second output terminal O2 jumps from the first potential signal VGH to the second potential signal VGL, i.e. the process in which the second output terminal O2 outputs the second potential signal VGL, to make the potential of the fourth node N4 reach a low enough potential, thereby reducing the level loss of the low-level signal output from the second output terminal O2. Moreover, since the second clock signal CLK2 may be a periodic clock signal, the second output control module 60 can also periodically pull down the potential of the fourth node N4 to the potential lower than the potential of the second potential signal VGL when the potential of the second clock signal CLK2 jumps. Even if the potential of the fourth node N4 keeps extremely low for a long time, the potential of the fourth node N4 is not raised to the potential higher than the potential of the second potential signal VGL due to the leakage. Therefore, this embodiment not only reduces the level loss of the effective level signal output from the second output terminal O2, but also improves the tailing problem of the output signals, helping to maintain the stability of the second output terminal O2 in outputting the effective level signals for a long time.

In addition, the first input module 10, under the control of the first clock signal CLK1, can periodically transmit the first start signal IN to the first node N1, the potential of the first node N1 affects the potential of the fourth node N4, and the second output module 40, under the control of the fourth node N4, transmits the second potential signal VGL to the second output terminal O2, so the pulse width of the effective level signal output from the second output terminal O2 of the shift register can be adjusted by adjusting the pulse width of the effective level signal of the first start signal IN. The second input module 20, under the control of the first clock signal CLK1, can periodically transmit the second start signal INB to the second node N2, the potential of the second node N2 affects the potential of the third node N3, the first output module 30, under the control of the third node N3, transmits the second potential signal VGL to the first output terminal O1, and the pulse width of the second start signal INB depends on the pulse width of the first start signal IN, so the pulse width of the effective level signal output from the first output terminal O1 can also be adjusted when the pulse width of the first start signal IN is adjusted. In view of the above, in the solutions of this embodiment, it is feasible to adjust the pulse width of the effective level signals of the first start signals IN input from the shift register to adjust the pulse width of the effective level signals of the output signals of the first output terminal O1 and the second output terminal O2 of the shift register. When the pulse width of the effective level signals of the first start signals IN is set to be greater than the pulse width of the effective level signals of first clock signals CLK1 and second clock signals CLK2, the pulse width of the effective level signals of the output signals of the first output terminal O1 and the second output terminal O2 is also greater than the pulse width of the effective level signals of the first clock signals CLK1 and the second clock signals CLK2.

In the shift register provided by the embodiments of the present applicant, the first output control module can couple the potential of the third node to a low enough potential through the first coupling unit when the first output terminal jumps from a high potential to a low potential to reduce the level loss when the first output module transmits the second potential signal to the first output terminal, thereby improving the tailing problem at the falling edge of the output signal of the first output terminal. Moreover, the first output control module can also periodically pull down the potential of the third node in the process in which the first output module transmits the second potential signal to the first output terminal, thereby reducing the level loss when the first output terminal outputs the second potential signal. Similarly, the second output control module can couple the potential of the fourth node to a low enough potential through the second coupling unit when the second output terminal jumps from a high potential to a low potential to reduce the level loss when the second output module transmits the second potential signal to the second output terminal, thereby improving the tailing problem at the falling edge of the output signal of the second output terminal. Moreover, the second output control module can also periodically pull down the potential of the fourth node in the process in which the second output module transmits the second potential signal to the second output terminal, thereby reducing the level loss when the second output terminal outputs the second potential signal. In addition, it is feasible to adjust the pulse width of the effective level signals of the first start signals to adjust the pulse width of the effective level signals output from the first output terminal and the second output terminal. In the solutions of the present application, two paths of output signals whose pulse width of the effective level signals is adjustable are obtained through shift registers according to two opposite paths of input signals, facilitating reducing the level loss when the shift registers output the effective level signals, thereby improving the tailing problem at the falling edge of the output signals, and helping to maintain the stability when the shift registers output the effective level signals, thereby making the application range of the shift registers wider.

Figure 4:
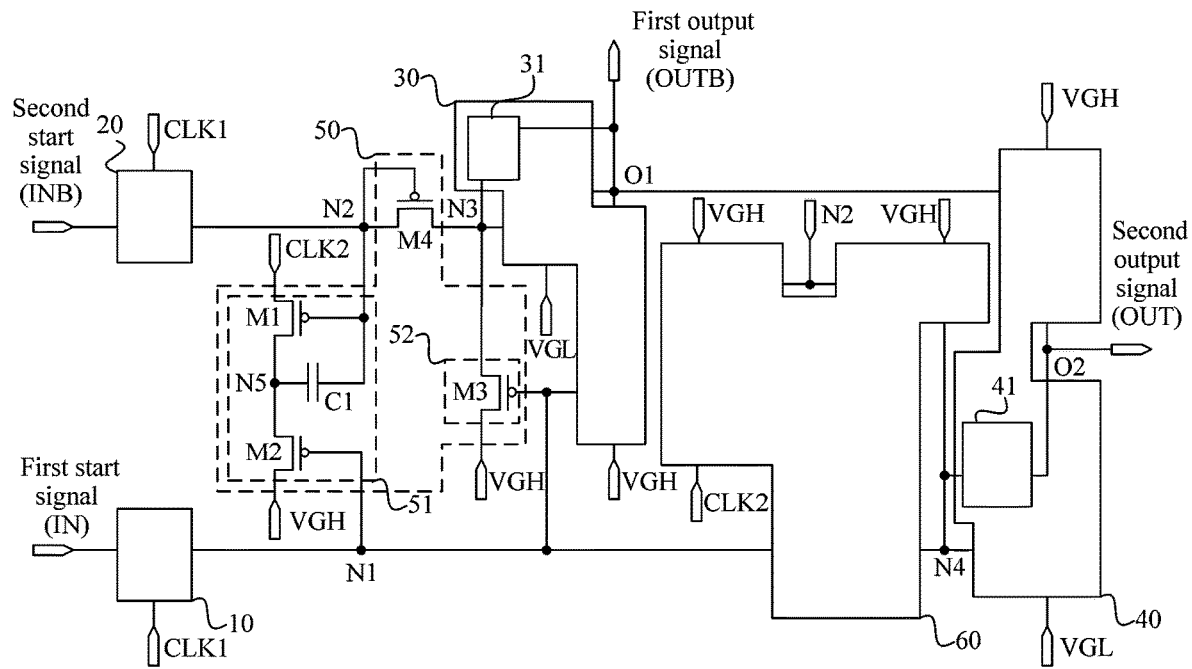
FIG. 4 is a structure diagram of modules of another shift register according to an embodiment of the present application.

FIG. 4 is a structure diagram of modules of another shift register according to an embodiment of the present application. As shown in FIG. 4, on the basis of the above embodiments, optionally, it is set that the second node N2 is electrically connected to the third node N3; the first output control module 50 includes a first sub-output control unit 51 and a second sub-output control unit 52; the first sub-output control unit 51 is configured to, under the control of the first node N1 and the second node N2, pull down the potential of the second node N2 to the potential lower than the potential of the second potential signal VGL and the potential of the third node N3 to the potential lower than the potential of the second potential signal VGL in the case where the second clock signal CLK2 jumps from a first potential to a second potential; and the second sub-output control unit 52 is configured to control the potential of the third node N3 according to the first potential signal VGH.

The second node N2 may be directly or indirectly electrically connected to the third node N3. For example, the second node N2 may be electrically connected to the third node N3 through the transistor to control the potential of the third node N3 according to the potential of the second node N2. The first potential refers to the potential of the first potential signal VGH, for example, the potential corresponding to a high-level signal. The second potential refers to the potential of the second potential signal VGL, for example, the potential corresponding to a low-level signal.

The first sub-output control unit 51, under the control of the first node N1 and the second node N2, can pull down the potential of the second node N2 to a low enough potential when the second clock signal CLK2 jumps from the high level to the low level and pull down the potential of the third node N3 to a low enough potential to periodically pull down the potential of the third node N3 to the potential lower than the potential of the second potential signal VGL according to the jumping of the second clock signal CLK2 in the process in which the first output module 30 transmits the second potential signal VGL to the first output terminal O1 to make the potential of the third node N3 reach a low enough potential, thereby reducing the level loss of the low-level signal output from the first output terminal O1, and helping to maintain the stability of the first output terminal O1 in outputting the effective level signals for a long time.

The second sub-output control unit 52 can also control the potential of the third node N3 according to the first potential signal VGH to transmit the first potential signal VGH to the third node N3 when the first output module 30 transmits the first potential signal VGH to the first output terminal O1 in response to the effective level signal of the first node N1, avoiding that the first output module 30 transmits the second potential signal VGL to the first output terminal O1 in response to the signal of the third node N3, and helping to maintain the stability of the first output terminal O1 in outputting the first potential signals VGH.

Referring to FIG. 4, on the basis of the above embodiments, optionally, it is set that the first sub-output control unit 51 includes a first transistor M1, a second transistor M2, and a first capacitor C1, where a gate of the first transistor M1 is connected to the second node N2 and a second terminal of the first capacitor C1, a first electrode of the first transistor M1 is input into the second clock signal CLK2, and a second electrode of the first transistor M1 is connected to a first terminal of the first capacitor C1 and a second electrode of the second transistor M2; and a gate of the second transistor M2 is connected to the first node N1, and a first electrode of the second transistor M2 inputs the first potential signal VGH; and the second sub-output control unit 52 includes a third transistor M3, where a gate of the third transistor M3 is connected to the first node N1, a first electrode of the third transistor M3 inputs the first potential signal VGH, and a second electrode of the third transistor M3 is connected to the third node N3.

The first transistor M1, the second transistor M2, and the third transistor M3 may be each a p-type transistor or an n-type transistor. In this embodiment and the embodiments below, the case where multiple transistors in the shift register are all p-type transistors is used as an example for description.

The first transistor M1 is turned on in response to the low-level signal of the second node N2, and the first transistor M1 transmits the second clock signal CLK2 to a fifth node N5 between the first transistor M1 and the second transistor M2 when the first transistor M1 is on. The second transistor M2 is turned on in response to the low-level signal of the first node N1, and the second transistor M2 transmits the first potential signal VGH to the fifth node N5 when the second transistor M2 is on. For example, when the second clock signal CLK2 is at a high level, the first node N1 is at a high level, and the second node N2 is at a low level, the second transistor M2 is turned off, the first transistor M1 is turned on, and the second clock signal CLK2 is transmitted to the fifth node N5 to make the fifth node N5 at a high level. When the second clock signal CLK2 jumps from the high level to the low level, the first node N1 is still at a high level, and the second node N2 is still at a low level, the first transistor M1 transmits the second clock signal CLK2 to the fifth node N5 to make the fifth node N5 jump from a high level to a low level. The first capacitor C1 has a coupling effect, so when the fifth node N5 at one terminal of the first capacitor C1 jumps from the high level to the low level, the first capacitor C1 can couple the potential of the second node N2 at the other terminal of the first capacitor C1 from the potential corresponding to the low level to a lower potential. For example, the first capacitor C1 can couple the potential of the second node N2 to the potential lower than the potential of the second potential signal VGL to make the third node N3 reach a low enough potential, thereby ensuring that the first output module 30 transmits the second potential signal VGL to the first output terminal O1 in response to the low-level signal of the third node N3.

The third transistor M3 is turned on in response to the low-level signal of the first node N1, and the third transistor M3 transmits the first potential signal VGH to the third node N3 when the third transistor M3 is on. For example, when the first output module 30 transmits the first potential signal VGH to the first output terminal O1 in response to the low-level signal of the first node N1, the first output module 30 may control the first node N1 to be at a low level to make the third transistor M3 transmit the first potential signal VGH to the third node N3 to make the third node N3 at a high level, thereby avoiding that the first output module 30 transmits the second potential signal VGL to the first output terminal O1 in response to the signal of the third node N3, and helping to maintain the stability of the first output terminal O1 in outputting the first potential signals VGH.

Referring to FIG. 4, on the basis of the above embodiments, optionally, it is set that the first output control module 50 also includes a fourth transistor M4, where the fourth transistor M4 is connected between the second node N2 and the third node N3, and a gate of the fourth transistor M4 is connected to the second node N2.

The fourth transistor M4 is turned on in response to the low-level signal of the second node N2. The second node N2 is electrically connected to the third node N3 through the fourth transistor M4. Since the gate of the fourth transistor M4 is connected to the first electrode of the fourth transistor M4, the diode-connected fourth transistor M4 may transmit the potential signal of the second node N2 rightward to the third node N3 when the fourth transistor M4 is on to control the potential of the third node N3 through the potential of the second node N2.

In addition, the first coupling unit 31 can couple the potential of the third node N3 to an extremely low potential that is lower than the potential of the second potential signal VGL at the time when the output signal of the first output terminal O1 jumps from the first potential signal VGH to the second potential signal VGL. Therefore, when the potential of the third node N3 is extremely low, leakage paths are generated between the third transistor M3 and the third node N3, and between the fourth transistor M4 and the third node N3 to make the potential of the third node N3 slowly increase, but in this embodiment, the first capacitor C1 is provided to periodically pull down the potential of the third node N3 according to the jumping of the second clock signal CLK2 to avoid the potential of the third node N3 from increasing to the potential corresponding to the second potential signal VGL due to the leakage so that the potential of the third node N3 can reach a low enough potential, thereby reducing the level loss of the low-level signal output from the first output terminal O1.

Figure 5:
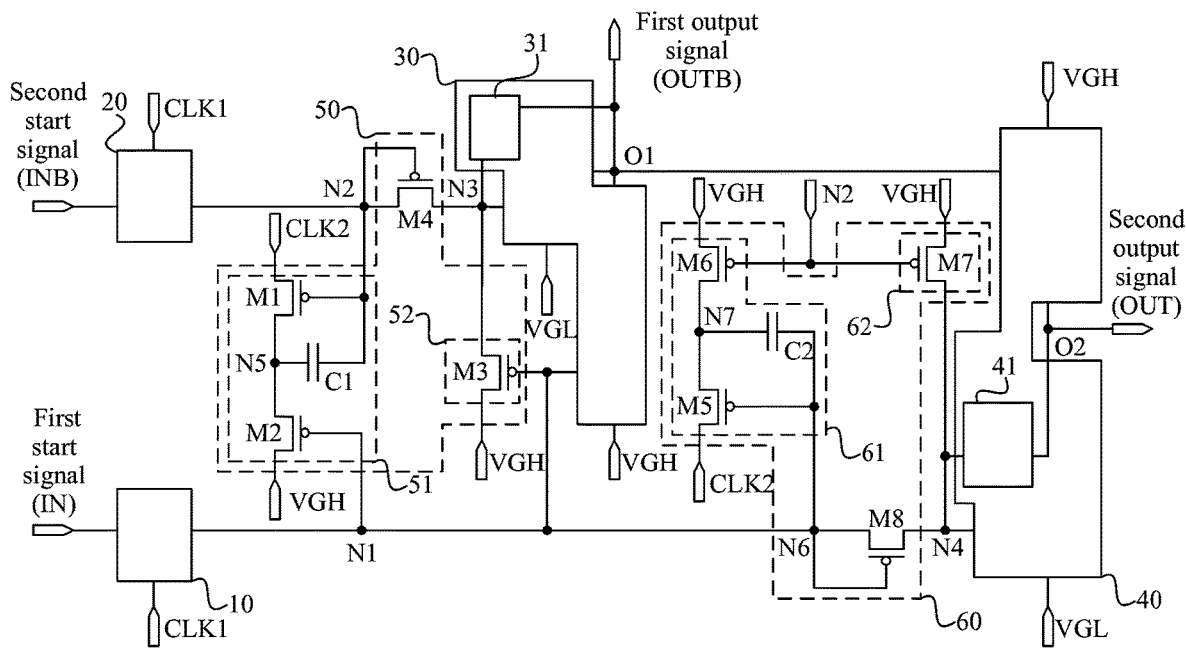
FIG. 5 is a structure diagram of modules of another shift register according to an embodiment of the present application.

FIG. 5 is a structure diagram of modules of another shift register according to an embodiment of the present application. As shown in FIG. 5, optionally, it is set that the first node N1 is electrically connected to the fourth node N4; the second output control module 60 includes a third sub-output control unit 61 and a fourth sub-output control unit 62, where the third sub-output control unit 61 is configured to, under the control of the first node N1 and the second node N2, the potential of the first node N1 to the potential lower than the potential of the second potential signal VGL and the potential of the fourth node N4 to the potential lower than the potential of the second potential signal VGL in the case where the second clock signal CLK2 jumps from the first potential to the second potential; and the fourth sub-output control unit 62 is configured to control the potential of the fourth node N4 according to the first potential signal VGH.

The first node N1 may be directly or indirectly electrically connected to the fourth node N4. For example, the first node N1 may be electrically connected to the fourth node N4 through a transistor to control the potential of the fourth node N4 according to the potential of the first node N1.

The third sub-output control unit 61, under the control of the first node N1 and the second nodes N2, can pull down the potential of the first node N1 to a low enough potential when the second clock signal CLK2 jumps from the high level to the low level, and pull down the potential of the fourth node N4 to a low enough potential to periodically pull down the potential of the fourth node N4 to the potential lower than the potential of the second potential signal VGL according to the jumping of the second clock signal CLK2 in the process in which the second output module 40 transmits the second potential signal VGL to the second output terminal O2 to make the potential of the fourth node N4 reach a low enough potential, thereby reducing the level loss of the low-level signal output from the second output terminal O2, and helping to maintain the stability of the second output terminal O2 in outputting the effective level signals for a long time.

The fourth sub-output control unit 62 can also control the potential of the fourth node N4 according to the first potential signal VGH to transmit the first potential signal VGH to the fourth node N4 when the second output module 40 transmits the first potential signal VGH to the second output terminal O2 in response to the effective level signal of the first output terminal O1, avoiding that the second output module 40 transmits the second potential signal VGL to the second output terminal O2 in response to the signal of the fourth node N4, and helping to maintain the stability of the second output terminal O2 in outputting the first potential signals VGH.

Referring to FIG. 5, on the basis of the above embodiments, optionally, it is set that the third sub-output control unit 61 includes a fifth transistor M5, a sixth transistor M6, and a second capacitor C2, where a gate of the fifth transistor M5 is connected to the first node N1 and a second terminal of the second capacitor C2, a first electrode of the fifth transistor M5 is input into the second clock signal CLK2, and a second electrode of the fifth transistor M5 is connected to a first terminal of the second capacitor C2 and a second electrode of the sixth transistor M6; and a gate of the sixth transistor M6 is connected to the second node N2, and a first electrode of the sixth transistor M6 is input into the first potential signal VGH; and the fourth sub-output control unit 62 includes a seventh transistor M7, where a gate of the seventh transistor M7 is connected to the second node N2, a first electrode of the seventh transistor M7 is input into the first potential signal VGH, and a second electrode of the seventh transistor M7 is connected to the fourth node N4.

The fifth transistor M5 is turned on in response to the low-level signal of the first node N1 (i.e. the sixth node N6), and the fifth transistor M5 transmits the second clock signal CLK2 to the seventh node N7 between the fifth transistor M5 and the sixth transistor M6 when the fifth transistor M5 is on. The sixth transistor M6 is turned on in response to the low-level signal of the second node N2, and the sixth transistor M6 transmits the first potential signal VGH to the seventh node N7 when the sixth transistor M6 is on. For example, when the second clock signal CLK2 is at a high level, the first node N1 is at a low level, and the second node N2 is at a high level, the sixth node N6 is at a low level, the sixth transistor M6 is turned off, the fifth transistor M5 is turned on, and the second clock signal CLK2 is transmitted to the seventh node N7 to make the seventh node N7 at a high level. When the second clock signal CLK2 jumps from the high level to the low level, the first node N1 is still at a low level, and the second node N2 is still at a high level, the fifth transistor M5 transmits the second clock signal CLK2 to the seventh node N7 to make the seventh node N7 jump from a high level to a low level. The second capacitor C2 has a coupling effect, so when the seventh node N7 at one terminal of the second capacitor C2 jumps from the high level to the low level, the second capacitor C2 can couple the potential of the sixth node N6 at the other terminal of the second capacitor C2 from the potential corresponding to the low level to a lower potential. For example, the second capacitor C2 can couple the potential of the sixth node N6 to the potential lower than the potential of the second potential signal VGL to make the fourth node N4 reach a low enough potential, thereby ensuring that the second output module 40 transmits the second potential signal VGL to the second output terminal O2 in response to the low-level signal of the fourth node N4.

The seventh transistor M7 is turned on in response to the low-level signal of the second node N2, and the seventh transistor M7 transmits the first potential signal VGH to the fourth node N4 when the seventh transistor M7 is on. For example, when the second output module 40 transmits the first potential signal VGH to the second output terminal O2 in response to the low-level signal of the first output terminal O1, the second output module 40 may control the second node N2 to be at a low level to make the seventh transistor M7 transmit the first potential signal VGH to the fourth node N4 to make the fourth node N4 at a high level, thereby avoiding that the second output module 40 transmits the second potential signal VGL to the second output terminal O2 in response to the signal of the fourth node N4, and helping to maintain the stability of the second output terminal O2 in outputting the first potential signals VGH.

Referring to FIG. 5, on the basis of the above embodiment, optionally, it is set that the second output control module 60 also includes an eighth transistor M8, where the eighth transistor M8 is connected between the first node N1 and the fourth node N4, and a gate of the eighth transistor M8 is connected to the first node N1.

The eighth transistor M8 is turned on in response to the low-level signal of the first node N1 (i.e. the sixth node N6). The sixth node N6 is electrically connected to the fourth node N4 through the eighth transistor M8. Since the gate of the eighth transistor M8 is connected to a first electrode, the diode-connected eighth transistor M8 may transmit the potential signal of the sixth node N6 rightward to the fourth node N4 when the eighth transistor M8 is on to control the potential of the fourth node N4 through the potential of the sixth node N6.

In addition, the second coupling unit 41 can couple the potential of the fourth node N4 to an extremely low potential that is lower than the potential of the second potential signal VGL at the time when the output signal of the second output terminal O2 jumps from the first potential signal VGH to the second potential signal VGL. Therefore, when the potential of the fourth node N4 is extremely low, leakage paths are generated between the seventh transistor M7 and the fourth node N4, and between the eighth transistor M8 and the fourth node N4 to make the potential of the fourth node N4 slowly increase, but in this embodiment, the second capacitor C2 is provided to periodically pull down the potential of the fourth node N4 according to the jumping of the second clock signal CLK2 to avoid the potential of the fourth node N4 from increasing to the potential corresponding to the second potential signal VGL due to the leakage so that the potential of the fourth node N4 can reach a low enough potential, thereby reducing the level loss of the low-level signal output from the second output terminal O2.

Figure 6:
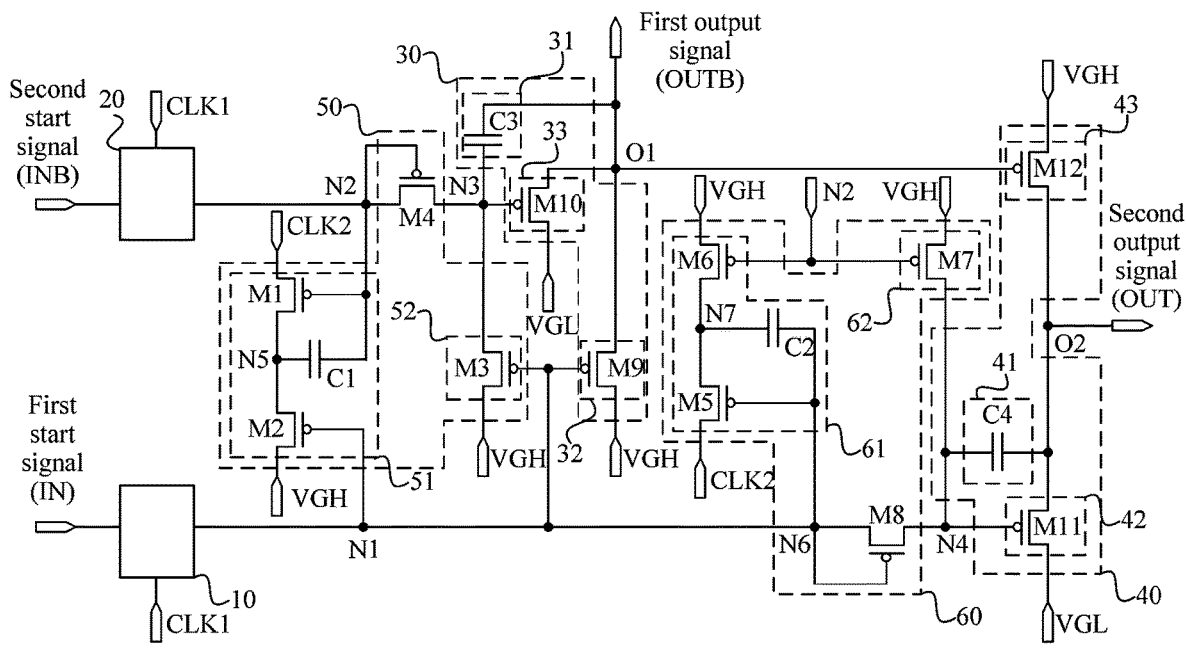
FIG. 6 is a structure diagram of modules of another shift register according to an embodiment of the present application.

FIG. 6 is a structure diagram of modules of another shift register according to an embodiment of the present application. As shown in FIG. 6, optionally, the first coupling unit 31 is configured to couple the potential of the third node N3 to the potential lower than the potential of the second potential signal VGL in the case where the potential of the first output terminal O1 jumps from a first potential to a second potential. The first output module 30 also includes a first output unit 32 and a second output unit 33, where the first output unit 32 is configured to be turned on or off according to the potential of the first node N1 and to transmit the first potential signal VGH to the first output terminal O1 in the case where the first output unit 32 itself is on; and the second output unit 33 is configured to be turned on or off according to the potential of the third node N3 and to transmit the second potential signal VGL to the first output terminal O1 of the shift register in the case where the second output unit 33 itself is on.

The first output unit 32 may be turned on in response to the low-level signal of the first node N1, and the first output unit 32 transmits the first potential signal VGH to the first output terminal O1 when the first output unit 32 is on. The second output unit 33 may be turned on in response to the low-level signal of the third node N3, and the second output unit 33 transmits the second potential signal VGL to the first output terminal O1 when the second output unit 33 is on. For example, before the low-level signal of the third node N3 arrives, the first output unit 32 transmits the first potential signal VGH to the first output terminal O1, and the potential of the first output terminal O1 is a high potential. When the low-level signal of the third node N3 arrives, the second output unit 33 transmits the second potential signal VGL to the first output terminal O1 in response to the low-level signal of the third node N3, and the potential of the first output terminal O1 jumps from a high potential to a low potential. Due to the coupling effect of the first coupling unit 31, the first coupling unit 31 may couple the potential of the third node N3 to the potential lower than the potential of the second potential signal VGL when the potential of the first output terminal O1 jumps to reduce the level loss when the first output module 30 transmits the second potential signal VGL to the first output terminal O1, and make the output signal of the first output terminal O1 directly jump from the first potential signal VGH to the second potential signal VGL to improve the tailing problem at the falling edge of the output signal of the first output terminal O1

Referring to FIG. 6, optionally, it is set that the first output unit 32 includes a ninth transistor M9, where a gate of the ninth transistor M9 is connected to the first node N1, a first electrode of the ninth transistor M9 is input into the first potential signal VGH, and a second electrode of the ninth transistor M9 is connected to the first output terminal O1; the second output unit 33 includes a tenth transistor M10, where a gate of the tenth transistor M10 is connected to the third node N3, a first electrode of the tenth transistor M10 is input into the second potential signal VGL, and a second electrode of the tenth transistor M10 is connected to the first output terminal O1; and the first coupling unit 31 includes a third capacitor C3, where a first terminal of the third capacitor C3 is connected to the first output terminal O1, and a second terminal of the third capacitor C3 is connected to the third node N3.

The ninth transistor M9 is turned on in response to the low-level signal of the first node N1, and the ninth transistor M9 transmits the first potential signal VGH to the first output terminal O1 when the ninth transistor M9 is on. The tenth transistor M10 is turned on in response to the low-level signal of the third node N3, and the tenth transistor M10 transmits the second potential signal VGL to the first output terminal O1 when the tenth transistor M10 is on. For example, when the output signal of the first output terminal O1 jumps from the first potential signal VGH to the second potential signal VGL, the third node N3 is at a low level. The third capacitor C3 has a coupling effect, so when the first output terminal O1 at one terminal of the third capacitor C3 is at a low level, the third capacitor C3 can couple the potential of the third node N3 at the other terminal of the third capacitor C3 from the potential corresponding to the low level to a lower potential. For example, the third capacitor C3 can couple the potential of the third node N3 to the potential lower than the potential of the second potential signal VGL to make the absolute value of the difference between the potential of the third node N3 and the potential of the second potential signal VGL be less than a set threshold value, thereby ensuring that the first output module 30 transmits the second potential signal VGL to the first output terminal O1 in response to the low-level signal of the third node N3, reducing the level loss when the first output module 30 transmits the second potential signal VGL to the first output terminal O1, and making the output signal of the first output terminal O1 directly jump from the first potential signal VGH to the second potential signal VGL to improve the tailing problem at the falling edge of the output signal of the first output terminal O1. Here, the set threshold value may be equal to the threshold voltage of the tenth transistor M10.

Referring to FIG. 6, optionally, the second coupling unit 41 is configured to couple the potential of the fourth node N4 to the potential lower than the potential of the second potential signal VGL in the case where the potential of the second output terminal O2 jumps from a first potential to a second potential; and the second output module 40 includes a third output unit 42 and a fourth output unit 43, where the third output unit 42 is configured to be turned on or off according to the potential of the fourth node N4 and to transmit the second potential signal VGL to the second output terminal O2 in the case where the third output unit 42 itself is on; and the fourth output unit 43 is configured to be turned on or off according to the potential of the first output terminal O1 and to transmit the first potential signal VGH to the second output terminal O2 of the shift register in the case where the first potential signal VGH itself is on.

The third output unit 42 may be turned on in response to the low-level signal of the fourth node N4, and the third output unit 42 transmits the second potential signal VGL to the second output terminal O2 when the third output unit 42 is on. The fourth output unit 43 may be turned on in response to the low-level signal of the first output terminal O1, and the fourth output unit 43 transmits the first potential signal VGH to the second output terminal O2 when the fourth output unit 43 is on. For example, before the low-level signal of the fourth node N4 arrives, the fourth output unit 43 transmits the first potential signal VGH to the second output terminal O2. When the low-level signal of the fourth node N4 arrives, the third output unit 42 transmits the second potential signal VGL to the second output terminal O2 in response to the low-level signal of the fourth node N4, and the potential of the second output terminal O2 jumps from a high potential to a low potential. Due to the coupling effect of the second coupling unit 41, the second coupling unit 41 may couple the potential of the fourth node N4 to the potential lower than the potential of the second potential signal VGL when the potential of the second output terminal O2 jumps to reduce the level loss when the second output module 40 transmits the second potential signal VGL to the second output terminal O2, and make the output signal of the second output terminal O2 directly jump from the first potential signal VGH to the second potential signal VGL to improve the tailing problem at the falling edge of the output signal of the second output terminal O2.

Referring to FIG. 6, optionally, it is set that the third output unit 42 includes an eleventh transistor M11, where a gate of the eleventh transistor M11 is connected to the fourth node N4, a first electrode of the eleventh transistor M11 is input into the second potential signal VGL, and a second electrode of the eleventh transistor M11 is connected to the second output terminal O2; the second coupling unit 41 includes a fourth capacitor C4, where a first terminal of the fourth capacitor C4 is connected to the second output terminal O2, and a second terminal of the fourth capacitor C4 is connected to the fourth node N4; and the fourth output unit 43 includes a twelfth transistor M12, where a gate of the twelfth transistor M12 is connected to the first output terminal O1, a first electrode of the twelfth transistor M12 is input into the first potential signal VGH, and a second electrode of the twelfth transistor M12 is connected to the second output terminal O2.

The eleventh transistor M11 is turned on in response to the low-level signal of the fourth node N4, and the eleventh transistor M11 transmits the second potential signal VGL to the second output terminal O2 when the eleventh transistor M11 is on. The twelfth transistor M12 is turned on in response to the low-level signal of the first output terminal O1, and the twelfth transistor M12 transmits the first potential signal VGH to the second output terminal O2 when the twelfth transistor M12 is on. For example, when the output signal of the second output terminal O2 jumps from the first potential signal VGH to the second potential signal VGL, the fourth node N4 is at a low level. The fourth capacitor C4 has a coupling effect, so when the second output terminal O2 at one terminal of the fourth capacitor C4 jumps from a high level to a low level, the fourth capacitor C4 can couple the potential of the fourth node N4 at the other terminal of the fourth capacitor C4 from the potential corresponding to the low level to a lower potential. For example, the fourth capacitor C4 can couple the potential of the fourth node N4 to the potential lower than the potential of the second potential signal VGL to make the absolute value of the difference between the potential of the fourth node N4 and the potential of the second potential signal VGL be less than a set threshold value, thereby ensuring that the second output module 40 transmits the second potential signal VGL to the second output terminal O2 in response to the low-level signal of the fourth node N4, reducing the level loss when the second output module 40 transmits the second potential signal VGL to the second output terminal O2, and making the output signal of the second output terminal O2 directly jump from the first potential signal VGH to the second potential signal VGL to improve the tailing problem at the falling edge of the output signal of the second output terminal O2. Here, the set threshold value may be equal to the threshold voltage of the eleventh transistor M11.

Figure 7:
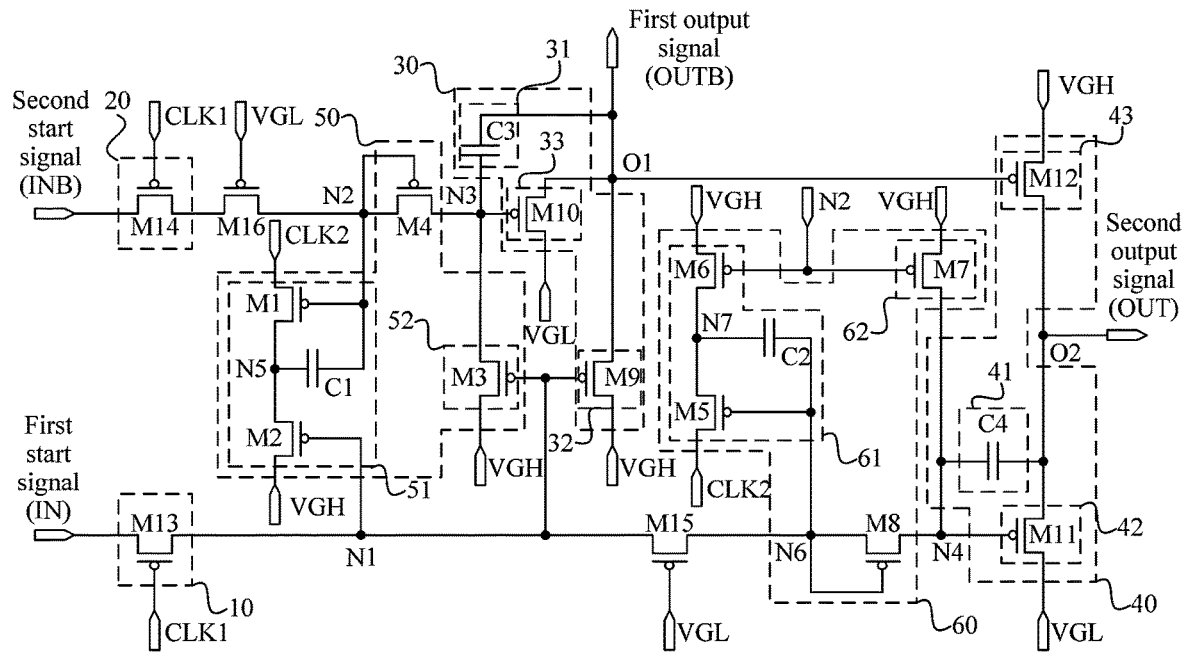
FIG. 7 is a structure diagram of modules of another shift register according to an embodiment of the present application.

FIG. 7 is a structure diagram of modules of another shift register according to an embodiment of the present application. As shown in FIG. 7, optionally, it is set that the first input module 10 includes a thirteenth transistor M13, where a gate of the thirteenth transistor M13 is input into the first clock signal CLK1, a first electrode of the thirteenth transistor M13 is input into the first start signal IN, and a second electrode of the thirteenth transistor M13 is connected to the first node N1; and the second input module 20 includes a fourteenth transistor M14, where a gate of the fourteenth transistor M14 is input into the first clock signal CLK1, a first electrode of the fourteenth transistor M14 is input into the second start signal INB, and a second electrode of the fourteenth transistor M14 is connected to the second node N2.

The thirteenth transistor M13 may be turned on in response to the low-level signal of the first clock signal CLK1, and the thirteenth transistor M13 transmits the first start signal IN to the first node N1 when the thirteenth transistor M13 is on, thereby controlling the potential of the first node N1 to control the signals output from the first output terminal O1 of the first output module 30. The fourteenth transistor M14 may be turned on in response to the low-level signal of the first clock signal CLK1, and the fourteenth transistor M14 transmits the second start signal INB to the second node N2 when the fourteenth transistor M14 is on, thereby controlling the potential of the second node N2 to control the signals output from the first output terminal O1 of the first output module 30.

Referring to FIG. 7, on the basis of the above embodiments, optionally, it is set that the shift register also includes a fifteenth transistor M15 connected between the first node N1 and the fourth node N4, where a gate of the fifteenth transistor M15 is input into the second potential signal VGL; and the shift register also includes a sixteenth transistor M16 connected between the first input module 10 and the second node N2, where a gate of the sixteenth transistor M16 is input into the second potential signal VGL.

The fifteenth transistor M15 may be in a normally-on state in response to the second potential signal VGL. Due to the coupling effect of the fourth capacitor C4 or the second capacitor C2, the potential of the seventh node N7 may be at an extremely low potential that is lower than the potential of the second potential signal VGL. In this embodiment, the fifteenth transistor M15 helps to isolate the extremely low potential of the seventh node N7, avoiding transmitting the extremely low potential of the seventh node N7 to the first node N1, thereby affecting the normal working of the shift register. The sixteenth transistor M16 may be in a normally-on state in response to the second potential signal VGL. Due to the coupling effect of the third capacitor C3 or the first capacitor C1, the potential of the second node N2 may be at an extremely low potential that is lower than the second potential signal VGL. In this embodiment, the sixteenth transistor M16 helps to isolate the extremely low potential of the second node N2, avoiding transmitting the extremely low potential of the second node N2 to the fourteenth transistor M14, thereby affecting the normal working of the shift register.

Figure 8:
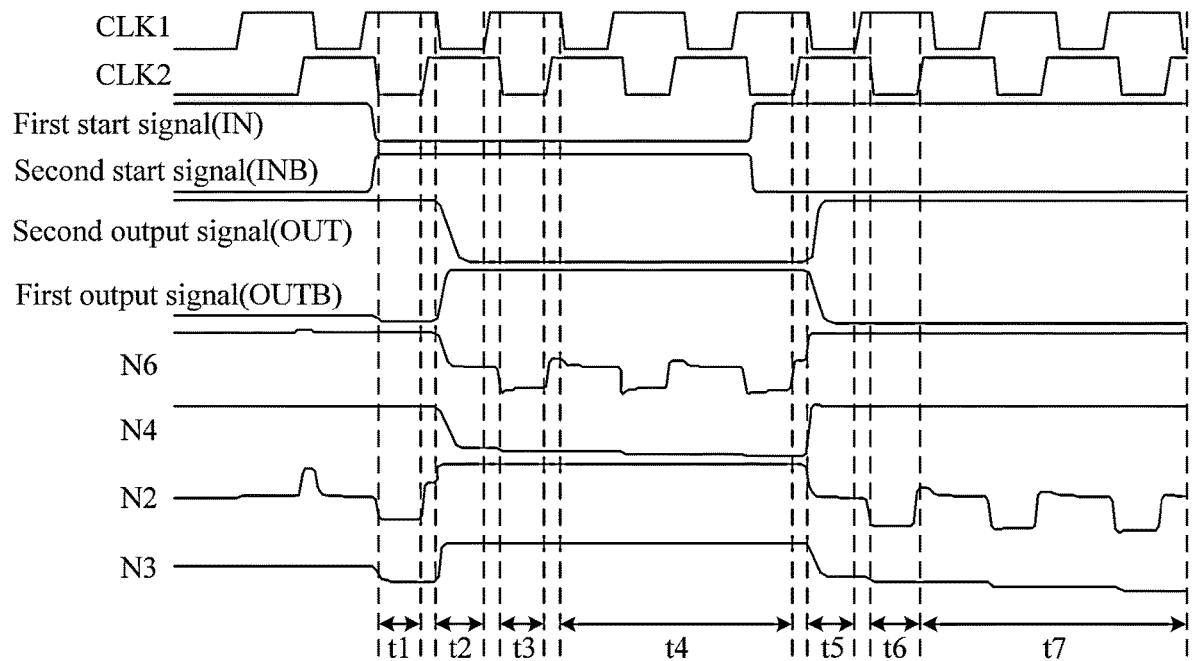
FIG. 8 is a driving timing diagram of a shift register according to an embodiment of the present application.

FIG. 8 is a driving timing diagram of a shift register according to an embodiment of the present application. This driving timing can be used for driving the operation of the shift register shown in FIGS. 3 to 7. The operation principles of the shift register provided in the embodiments of the present application are described below in conjunction with FIGS. 7 and 8. For example, the working process of the shift register includes at least a first stage t1, a second stage t2, a third stage t3, a fourth stage t4, a fifth stage t5, a sixth stage t6, and a seventh stage t7.

At the first stage t1, the first start signal IN input into the shift register is at a low level, the second start signal INB is at a high level, a first output signal OUTB output from the first output terminal O1 of the shift register is at a low level, and a second output signal OUT output from the second output terminal O2 is at a high level. At the first stage t1, the first output signal OUTB is opposite to the second start signal INB, and the second output signal OUT is opposite to the first start signal IN.

At the second stage t2, the first clock signal CLK1 is at a low level, the second clock signal CLK2 is at a high level, the first start signal IN is at a low level, and the second start signal INB is at a high level. The thirteenth transistor M13, the fourteenth transistor M14, the fifteenth transistor M15, and the sixteenth transistor M16 are turned on. The thirteenth transistor M13 transmits the first start signal IN to the first node N1, where the first node N1 is at a low level. The fourteenth transistor M14 transmits the second start signal INB to the second node N2, where the second node N2 is at a high level. The second transistor M2, the third transistor M3, the ninth transistor M9, the fifth transistor M5, the eighth transistor M8, and the eleventh transistor M11 are turned on, and the first transistor M1, the fourth transistor M4, the tenth transistor M10, the sixth transistor M6, the seventh transistor M7, and the twelfth transistor M12 are turned off. The sixth node N6 is at a low level, the fourth node N4 is at a low level, the fifth transistor M5 transmits the second clock signal CLK2 to the seventh node N7, the seventh node N7 at one terminal of the second capacitor C2 is at a high level, the sixth node N6 at the other terminal of the second capacitor C2 is at a low level, a potential difference is formed between the two terminals of the second capacitor C2, and the second capacitor C2 is charged. The ninth transistor M9 transmits the first potential signal VGH to the first output terminal O1, and the first output signal OUTB output from the first output terminal O1 is a high-level signal. The eleventh transistor M11 transmits the second potential signal VGL to the second output terminal O2, and the second output signal OUT output from the second output terminal O2 jumps from the high level to the low level. Due to the coupling effect of the fourth capacitor C4, the fourth capacitor C4 can couple the potential of the fourth node N4 from the potential corresponding to the low level to the potential lower than the potential of the second potential signal VGL (as shown in FIG. 8, the voltage of the fourth node N4 is approximate −11V). The potential of the fourth node N4 is low enough to make the eleventh transistor at a strong on state so that the second output signal OUT directly jumps from the first potential signal VGH to the second potential signal VGL, and the signal trailing does not occur at the falling edge of the second output signal OUT.

At the third stage t3, the first clock signal CLK1 is at a high level, the second clock signal CLK2 jumps from the high level to the low level, the first start signal IN is at a low level, and the second start signal INB is at a high level. The thirteenth transistor M13 and the fourteenth transistor M14 are turned off, and the states of the other transistors are the same as that in the second stage t2. The first node N1 is at a low level, the fourth node N4 is at a low level, the sixth node N6 is at a low level, and the second node N2 is at a high level. The first output signal OUTB output from the first output terminal O1 is a high-level signal, and the second output signal OUT output from the second output terminal O2 is a low-level signal. The fifth transistor M5 transmits the second clock signal CLK2 to the seventh node N7, where the seventh node N7 jumps from the low level to the high level. Due to the coupling effect of the second capacitor C2, the second capacitor C2 can couple the potential of the sixth node N6 from the potential corresponding to the low level to the potential lower than the potential of the second potential signal VGL (as shown in FIG. 8, the voltage of the sixth node N6 is about −14V), and pull down the potential of the fourth node N4 somewhat lower through the eighth transistor M8 to make the eleventh transistor M11 still at the strong on state so that the second output signal OUT has no low-level loss.

The working process of the shift register in the fourth stage t4 is similar to that in the second stage t2 and the third stage t3 and can refer to that in the second stage t2 and the third stage t3, and the details are not described herein. In the fourth stage t4, the first output signal OUTB output from the first output terminal O1 maintains the high-level signal, the second output signal OUT output from the second output terminal O2 maintains the low-level signal, and the second capacitor C2 can periodically pull down the potential of the sixth node N6 according to the jumping of the second clock signal CLK2 to continuously pull down the potential of the fourth node N4 to maintain the strong on state of the eleventh transistor M11, helping to maintain the stability of the second output signals OUT.

In the fifth stage t5, the first clock signal CLK1 is at a low level, the second clock signal CLK2 is at a high level, the first start signal IN is at a high level, and the second start signal INB is at a low level. The thirteenth transistor M13, the fourteenth transistor M14, the fifteenth transistor M15, and the sixteenth transistor M16 are turned on, the thirteenth transistor M13 transmits the first start signal IN to the first node N1, where the first node N1 is at a high level, and the fourteenth transistor M14 transmits the second start signal INB to the second node N2, where the second node N2 is at a low level. The first transistor M1, the fourth transistor M4, the tenth transistor M10, the sixth transistor M6, the seventh transistor M7, and the twelfth transistor M12 are turned on, and the second transistor M2, the third transistor M3, the ninth transistor M9, the fifth transistor M5, and the eleventh transistor M11 are turned off. The sixth node N6 is at a high level, the fourth node N4 is at a high level, and the eighth transistor M8 is turned off. The first transistor M1 transmits the second clock signal CLK2 to the fifth node N5, the fifth node N5 at one terminal of the first capacitor C1 is at a high level, the second node N2 at the other terminal of the first capacitor C1 is at a low level, a potential difference is formed between the two terminals of the first capacitor C1, and the first capacitor C1 is charged. The tenth transistor M10 transmits the second potential signal VGL to the first output terminal O1, and the first output signal OUTB outputted from the first output terminal O1 jumps from the high level to the low level. The twelfth transistor M12 transmits the first potential signal VGH to the second output terminal O2, and the second output signal OUT outputted from the second output terminal O2 is a high-level signal. Due to the coupling effect of the third capacitor C3, the third capacitor C3 can couple the potential of the third node N3 from the potential corresponding to the low level to the potential lower than the second potential signal VGL (as shown in FIG. 8, the voltage of the third node N3 is about −11V). The potential of the third node N3 is low enough to make the tenth transistor M10 at a strong on state so that the first output signal OUTB directly jumps from the first potential signal VGH to the second potential signal VGL, and the signal trailing does not occur at the falling edge of the first output signal OUTB.

In the sixth stage t6, the first clock signal CLK1 is at a high level, the second clock signal CLK2 jumps from the high level to the low level, the first start signal IN is at a high level, and the second start signal INB at a low level. The thirteenth transistor M13 and fourteenth transistor M14 are turned off, and the states of the other transistors are the same as that in the fifth stage t5. The first node N1 is at a high level, the fourth node N4 is at a high level, and the sixth node N6 is at a high level, and the second node N2 is at a low level. The first output signal OUTB output from the first output terminal O1 is a low-level signal, and the second output signal OUT output from the second output terminal O2 is a high-level signal. The first transistor M1 transmits the second clock signal CLK2 to the fifth node N5, and the fifth node N5 jumps from the high level to the low level. Due to the coupling effect of the first capacitor C1, the first capacitor C1 can couple the potential of the second node N2 from the potential corresponding to the low level to the potential lower than the second potential signal VGL (as shown in FIG. 8, the voltage of the second node N2 is about −14V), and pull down the potential of the third node N3 somewhat lower through the fourth transistor M4 to make the tenth transistor M10 still at the strong on state so that the first output signal OUTB has no low-level loss.

The working process of the shift register in the seventh stage t7 is similar to that in the fifth stage t5 and the sixth stage t6 and can refer to that in the fifth stage t5 and the sixth stage t6, and the details are not described herein. In the seventh stage t7, the first output signal OUTB outputted from the first output terminal O1 maintains the low-level signal, the second output signal OUT outputted from the second output terminal O2 maintains the high-level signal, and the first capacitor C1 can periodically pull down the potential of the second node N2 according to the jumping of the second clock signal CLK2 to continuously pull down the potential of the third node N3 to maintain the strong on state of the tenth transistor M10, helping to maintain the stability of the second output signals OUT.

The shift register provided by the embodiments of the present application may couple the potential of the third node N3 to a low enough potential as the first output signal OUTB output from the first output terminal O1 jumps from the high level to the low level through the third capacitor C3 to reduce the low-level loss of the first output signal OUTB, thereby improving the tailing problem at the falling edge of the first output signal OUTB. Moreover, the first capacitor C1 can periodically pull down the potential of the third node N3 when the first output signal OUTB is the low-level signal, thereby reducing the low-level loss of the first output signal OUTB and maintaining the stability of the first output terminal O1 in outputting the low-level signals. Similarly, the fourth capacitor C4 can reduce the low-level loss of the second output signal OUT and thus improve the tailing problem at the falling edge of the second output signal OUT output from the second output terminal O2; and the second capacitor C2 can reduce the low-level loss of the second output signal OUT and maintains the stability of the second output terminal O2 in outputting the low-level signals.

In addition, in this embodiment, the shift registers can shiftedly output the first start signals IN to obtain second output signals OUT, and shiftedly output the second start signals INB to obtain first output signals OUTB. Moreover, when the pulse width of the low-level signals of the first start signals IN is set to be greater than the pulse width of the low-level signals of the first clock signals CLK1 and the second clock signals CLK2, the pulse width of the low-level signals of the first output signals OUTB of the shift register and the pulse width of the low-level signals of the second output signals OUT are greater than the pulse width of the low-level signals of the clock signals, facilitating prolonging the low-level time of the output signals of the shift registers.

On the basis of the above solutions, the first transistor M1, the second transistor M2, the third transistor M3, the fourth transistor M4, the fifth transistor M5, the sixth transistor M6, the seventh transistor M7, the eighth transistor M8, the ninth transistor M9, the tenth transistor M10, the eleventh transistor M11, the twelfth transistor M12, the thirteenth transistor M13, the fourteenth transistor M14, the fifteenth transistor M15, and the sixteenth transistor M16 in the shift register provided by the embodiments of the present application may all be thin-film transistors. The display panel also includes a pixel circuit composed of the thin-film transistors. The multiple transistors in the shift register may be manufactured in the same process as the transistors in the pixel circuit, helping to simplify the manufacturing process of the display panel.

Figure 9:
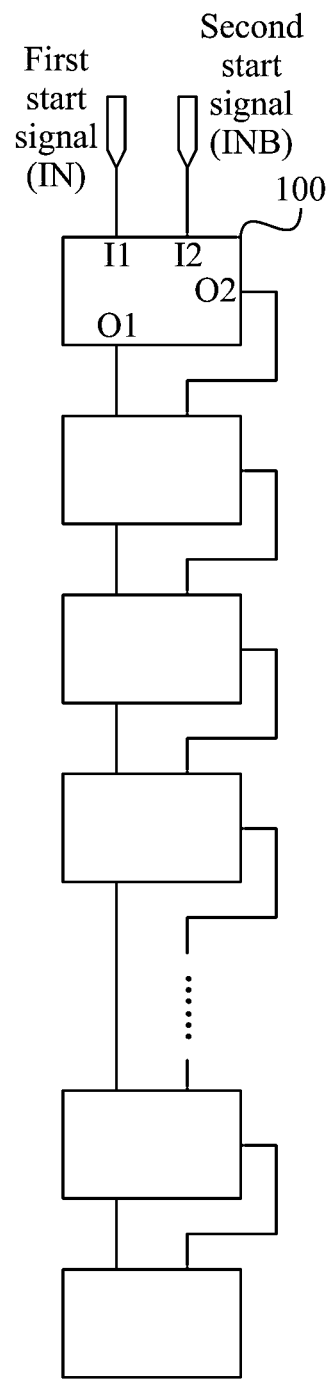
FIG. 9 is a structure diagram of modules of a gate driving circuit according to an embodiment of the present application.

The embodiments of the present application also provide a gate driving circuit including the shift registers provided by any one of the above embodiments of the present application. FIG. 9 is a structure diagram of modules of a gate driving circuit according to an embodiment of the present application. As shown in FIG. 9, The gate driving circuit includes multiple shift registers 100 connected in cascade. A first start signal input terminal I1 of a first stage shift register 100 is configured to be input into first start signals IN, a second start signal input terminal I2 of the first stage shift register 100 is configured to be input into second start signals INB, a first output terminal O1 of the first stage shift register 100 is electrically connected to a second start signal input terminal I2 of a next stage shift register 100, and a second output terminal O2 of the first stage shift register 100 is electrically connected to a first start signal input terminal I1 of the next stage shift register 100.

In conjunction with FIGS. 3, 7 to 9, the gate driving circuit includes the multiple shift registers 100 connected in cascade, and the shift registers in this embodiment can shiftedly output the first start signals IN to obtain the second output signals OUT, and shiftedly output the second start signals INB to obtain the first output signals OUTB. Therefore, when the shift registers are applied to the gate driving circuit, the second output signals OUT output from a current stage shift register can also serve as the first start signals IN input into the next stage shift register, and the first output signals OUTB output from the current stage shift register can also serve as the second start signals INB input into the next stage shift register, helping to transfer the output signals of the current stage shift register to the next stage shift register.

The gate driving circuit provided by the embodiments of the present application includes the shift registers provided by any one of the above embodiments of the present application so that the gate driving circuit has the corresponding function modules and effects of the shift register, and the details are not described herein.

Figure 10:
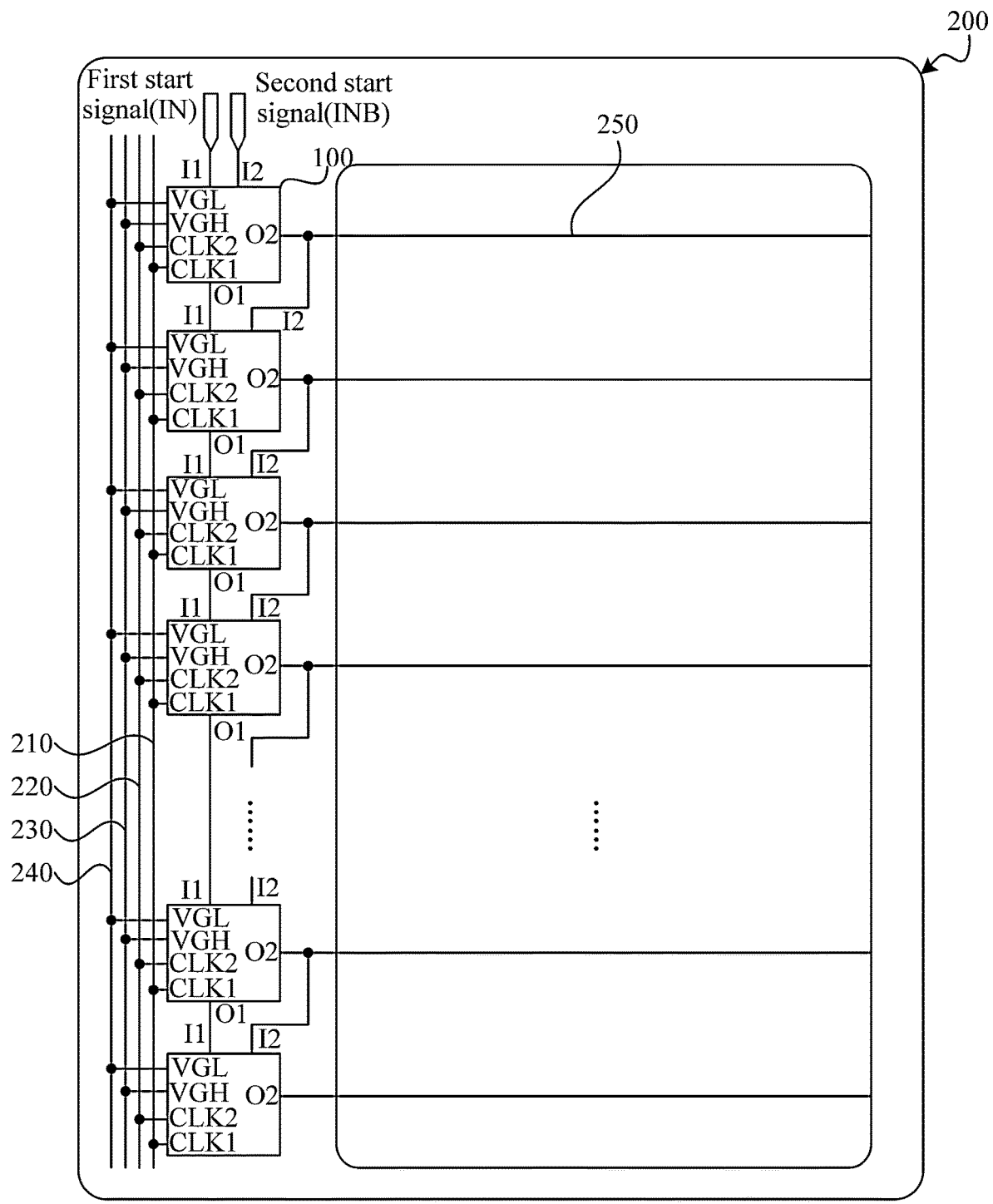
FIG. 10 is a structure diagram of a display panel according to an embodiment of the present application.

Embodiments of the present application also provide a display panel. FIG. 10 is a structure diagram of a display panel according to an embodiment of the present application. In conjunction with FIGS. 3 and 10, the display panel 100 includes the gate driving circuit provided by the embodiments described above and also includes a first clock signal line 210, a second clock signal line 220, a first potential signal line 230, and a second potential signal line 240, where the first clock signal line 210 is configured to transmit first clock signals CLK1 to shift registers 100; the second clock signal line 220 is configured to transmit second clock signals CLK2 to the shift registers 100; the first potential signal line 230 is configured to transmit first potential signals VGH to the shift registers 100; and the second potential signal line 240 is configured to transmit second potential signals VGL to the shift registers 100.

The display panel 100 may be, for example, an organic light-emitting diode display panel, a liquid crystal display panel, or the like. Optionally, the display panel 100 may also include a first start signal line configured to transmit the first start signals IN to the first stage shift register 100 in the gate driving circuit, the shift register may also generate inverse signals of the first start signals IN according to the received first start signals IN to obtain the second start signals INB and input the second start signals INB into the second start signal input terminal I2 of the first stage shift register 100. The first stage shift register can shiftedly output the first start signals IN and the second start signals INB to the next stage shift register, in two adjacent stage shift registers, the next stage shift register can shift and output the signals output from the preceding stage shift register, and the output signals of the second output terminal O2 of each stage shift register can serve as gate drive signals of the transistors of the pixel circuit in the display panel 100. Therefore, the display panel 100 provided by the embodiments of the present application achieves the function of outputting the gate drive signals (which, for example, may be scan signals or light-emitting control signals) row by row, and the pulse width of the gate drive signals output from multi-stage shift registers is adjustable and stable.

For example, the second output terminal O2 of each stage shift register is connected to a signal line 250 in the display panel 200. The signal line 250 may be a light-emitting control signal line or a scan line. When the shift registers are connected to the light-emitting control signal line, the gate drive signals output from the shift registers may serve as the light-emitting control signals to control on or OFF of light-emitting control transistors in the pixel circuit. When the shift registers are connected to the scan line, the gate drive signals output from the shift registers may serve as the scan signals to drive switch transistors in the pixel circuit to turn on or off. The switch transistors may include a data voltage write transistor, a threshold voltage compensation transistor, an initialization transistor for initializing the gate of a drive transistor, an initialization transistor for initializing the anode of a light-emitting device, and the like.

The display panel provided by the embodiments of the present application includes the gate driving circuit and the shift registers in the gate driving circuit provided by any one of the above embodiments of the present application. Therefore, the display panel has the function modules and effects corresponding to the gate driving circuit and the shift registers in the gate driving circuit, and the details are not described herein.

What is claimed is:

1. A shift register, comprising:
   a first input module configured to control a potential of a first node according to a first start signal and a first clock signal;
   a second input module configured to control a potential of a second node according to a second start signal and the first clock signal, wherein the second start signal and the first start signal have opposite potentials;
   a first output module configured to transmit the first potential signal or a second potential signal to a first output terminal of the shift register according to the potential of the first node and a potential of a third node, and comprising a first coupling unit configured to couple the potential of the third node according to a potential of the first output terminal in a case where the potential of the first output terminal jumps;
   a second output module configured to transmit the first potential signal or the second potential signal to a second output terminal of the shift register according to a potential of a fourth node and the potential of the first output terminal, and comprising a second coupling unit configured to couple the potential of the fourth node according to a potential of the second output terminal in a case where the potential of the second output terminal jumps;
   a first output control module configured to control the potential of the third node according to the potential of the first node, the potential of the second node, a first potential signal, and a second clock signal; and
   a second output control module configured to control the potential of the fourth node according to the potential of the first node, the potential of the second node, the first potential signal, and the second clock signal.

2. The shift register of claim 1, wherein the second node is electrically connected to the third node; and the first output control module comprises:
   a first sub-output control unit configured to, under the control of the first node and the second node, pull down the potential of the second node to a potential lower than a potential of the second potential signal and the potential of the third node to a potential lower than a potential of the second potential signal in a case where the second clock signal jumps from a first potential to a second potential; and
   a second sub-output control unit configured to control the potential of the third node according to the first potential signal.

3. The shift register of claim 2, wherein the first sub-output control unit further comprises:
   a first transistor,
   a second transistor, and
   a first capacitor, wherein a gate of the first transistor is connected to the second node and a second terminal of the first capacitor, a first electrode of the first transistor is configured to be input into the second clock signal, and a second electrode of the first transistor is connected to a first terminal of the first capacitor and a second electrode of the second transistor; and a gate of the second transistor is connected to the first node, and a first electrode of the second transistor is configured to be input into the first potential signal; and the second sub-output control unit further comprises:
a third transistor, wherein a gate of the third transistor is connected to the first node, a first electrode of the third transistor is configured to be input into the first potential signal, and a second electrode of the third transistor is connected to the third node.

4. The shift register of claim 3, wherein the first output control module further comprises:
a fourth transistor connected between the second node and the third node, wherein a gate of the fourth transistor is connected to the second node.

5. The shift register of claim 1, wherein the first node is electrically connected to the fourth node and; the second output control module comprises:
a third sub-output control unit, wherein the third sub-output control unit is configured to, under the control of the first node and the second node, pull down the potential of the first node a potential lower than the potential of the second potential signal and the potential of the fourth node to a potential lower than the potential of the second potential signal in a case where the second clock signal jumps from the first potential to the second potential; and
a fourth sub-output control unit, wherein the fourth sub-output control unit is configured to control the potential of the fourth node according to the first potential signal.

6. The shift register of claim 5, wherein the third sub-output control unit further comprises;
a fifth transistor;
a sixth transistor; and
a second capacitor, wherein a gate of the fifth transistor is connected to the first node and a second terminal of the second capacitor, a first electrode of the fifth transistor is configured to be input into the second clock signal, and a second electrode of the fifth transistor is connected to a first terminal of the second capacitor and a second electrode of the sixth transistor; and a gate of the sixth transistor is connected to the second node, and a first electrode of the sixth transistor is configured to be input into the first potential signal; and the fourth sub-output control unit further comprises:
a seventh transistor, wherein a gate of the seventh transistor is connected to the second node, a first electrode of the seventh transistor is configured to be input into the first potential signal, and a second electrode of the seventh transistor is connected to the fourth node.

7. The shift register of claim 6, wherein the second output control module further comprises:
an eighth transistor connected between the first node and the fourth node, wherein a gate of the eighth transistor is connected to the first node.

8. The shift register of claim 1, wherein the first coupling unit is configured to couple the potential of the third node to a potential lower than a potential of the second potential signal in a case where the potential of the first output terminal jumps from a first potential to a second potential; and the first output module further comprises:
a first output unit configured to be turned on or off according to the potential of the first node and to transmit the first potential signal to the first output terminal in a case where the first output unit itself is on; and
a second output unit configured to be turned on or off according to the potential of the third node and to transmit the second potential signal to the first output terminal of the shift register in a case where the second output unit itself is on.

9. The shift register of claim 8, wherein the first output unit further comprises:
a ninth transistor, wherein a gate of the ninth transistor is connected to the first node, a first electrode of the ninth transistor is configured to be input into the first potential signal, and a second electrode of the ninth transistor is connected to the first output terminal.

10. The shift register of claim 8, wherein the second output unit further comprises:
a tenth transistor, wherein a gate of the tenth transistor is connected to the third node, a first electrode of the tenth transistor is configured to be input into the second potential signal, and a second electrode of the tenth transistor is connected to the first output terminal.

11. The shift register of claim 8, wherein the first coupling unit further comprises:
a third capacitor, wherein a first terminal of the third capacitor is connected to the first output terminal, and a second terminal of the third capacitor is connected to the third node.

12. The shift register of claim 1, wherein the second coupling unit is configured to couple the potential of the fourth node to a potential lower than a potential of the second potential signal in a case where the potential of the second output terminal jumps from a first potential to a second potential; and the second output module further comprises a:
third output unit configured to be turned on or off according to the potential of the fourth node and to transmit the second potential signal to the second output terminal in a case where the third output unit itself is on; and
a fourth output unit is configured to be turned on or off according to the potential of the first output terminal and to transmit the first potential signal to the second output terminal of the shift register in a case where the fourth output unit itself is on.

13. The shift register of claim 12, wherein the third output unit further comprises:
an eleventh transistor, wherein a gate of the eleventh transistor is connected to the fourth node, a first electrode of the eleventh transistor is configured to be input into the second potential signal, and a second electrode of the eleventh transistor is connected to the second output terminal.

14. The shift register of claim 12, wherein the second coupling unit further comprises:
a fourth capacitor, wherein a first terminal of the fourth capacitor is connected to the second output terminal, and a second terminal of the fourth capacitor is connected to the fourth node.

15. The shift register of claim 12, wherein the fourth output unit further comprises:
a twelfth transistor, wherein a gate of the twelfth transistor is connected to the first output terminal, a first electrode of the twelfth transistor is configured to be input into the first potential signal, and a second electrode of the twelfth transistor is connected to the second output terminal.

16. The shift register of claim 1, wherein the first input module further comprises:
a thirteenth transistor, wherein a gate of the thirteenth transistor is configured to be input into the first clock signal, a first electrode of the thirteenth transistor is configured to be input into the first start signal, and a second electrode of the thirteenth transistor is connected to the first node; and the second input module further comprises:
- a fourteenth transistor, wherein a gate of the fourteenth transistor is configured to be input into the first clock signal, a first electrode of the fourteenth transistor is configured to be input into the second start signal, and a second electrode of the fourteenth transistor is connected to the second node.

17. The shift register of claim 16, wherein the shift register further comprises:
- a fifteenth transistor connected between the first node and the fourth node, wherein a gate of the fifteenth transistor is configured to be input into the second potential signal.

18. The shift register of claim 16, wherein the shift register further comprises:
- a sixteenth transistor connected between the first input module and the second node, wherein a gate of the sixteenth transistor is configured to be input into the second potential signal.

19. A gate driving circuit, comprising:
- a plurality of shift registers according to claim 1, wherein the plurality of shift registers is connected in cascade, a first start signal input terminal of a first stage shift register is configured to be input into first start signals, a second start signal input terminal of the first stage shift register is configured to be input into second start signals, a first output terminal of the first stage shift register is electrically connected to a second start signal input terminal of a next stage shift register, and a second output terminal of the first stage shift register is electrically connected to a first start signal input terminal of the next stage shift register.

20. A display panel, comprising: the gate driving circuit of claim 19 and further comprising:
- a first clock signal line configured to transmit first clock signals to a plurality of shift registers;
- a second clock signal line configured to transmit second clock signals to the plurality of shift registers;
- a first potential signal line configured to transmit first potential signals to the plurality of shift registers; and
- a second potential signal line configured to transmit second potential signals to the plurality of shift registers.

* * * * *